United States Patent
Lee et al.

(10) Patent No.: US 10,615,241 B2
(45) Date of Patent: Apr. 7, 2020

(54) DISPLAY DEVICE

(71) Applicant: Samsung Display Co., Ltd., Yongin-si, Gyeonggi-do (KR)

(72) Inventors: Youn Bum Lee, Gyeonggi-do (KR); Seon Mi Yoo, Gyeonggi-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/811,465

(22) Filed: Nov. 13, 2017

(65) Prior Publication Data
US 2018/0138261 A1 May 17, 2018

(30) Foreign Application Priority Data
Nov. 14, 2016 (KR) .......................... 10-2016-0151084

(51) Int. Cl.
*G06F 3/044* (2006.01)
*H01L 27/32* (2006.01)
*H01L 51/52* (2006.01)

(52) U.S. Cl.
CPC .......... *H01L 27/3276* (2013.01); *G06F 3/044* (2013.01); *H01L 51/5246* (2013.01); *H01L 51/5281* (2013.01); *G06F 2203/04102* (2013.01); *G06F 2203/04112* (2013.01); *H01L 27/323* (2013.01); *H01L 51/525* (2013.01)

(58) Field of Classification Search
CPC .......... G06F 3/044; G06F 2203/04102; G06F 2203/04112; H01L 27/3276; H01L 51/5246; H01L 51/5281; H01L 27/323; H01L 51/525

USPC .................................................. 345/156–184
See application file for complete search history.

(56) References Cited

U.S. PATENT DOCUMENTS

| | | | | |
|---|---|---|---|---|
| 2011/0080372 A1* | 4/2011 | Lee | ......................... | G06F 3/045 345/174 |
| 2012/0162938 A1* | 6/2012 | Kim | ...................... | G02F 1/1341 361/750 |
| 2013/0147727 A1* | 6/2013 | Lee | ....................... | G06F 3/0412 345/173 |
| 2014/0118271 A1* | 5/2014 | Lee | ....................... | G06F 3/0488 345/173 |
| 2014/0306942 A1* | 10/2014 | Ahn | ....................... | G06F 1/1652 345/206 |

(Continued)

FOREIGN PATENT DOCUMENTS

| KR | 10-2014-0122879 A | 10/2014 |
|---|---|---|
| KR | 10-2016-0069571 A | 6/2016 |
| KR | 10-2016-0106829 A | 9/2016 |

*Primary Examiner* — Carolyn R Edwards
(74) *Attorney, Agent, or Firm* — Lewis Roca Rothgerber Christie LLP (57) ABSTRACT

A display device according to one or more embodiments includes: a display panel including a plurality of pixels; a connector attached to the display panel; a display drive unit mounted on the connector; a touch sensor arranged over the display panel; a first adhesive layer between the touch sensor and the display panel; a window arranged over the touch sensor; and a second adhesive layer between the window and the touch sensor. A horizontal distance between the second adhesive layer and the display drive unit may be equal to or less than a horizontal distance between the display panel and the display drive unit.

11 Claims, 8 Drawing Sheets

(56) References Cited

U.S. PATENT DOCUMENTS

2015/0185960 A1\* 7/2015 Kim ..................... G06F 3/0412
  345/175
2016/0165726 A1 6/2016 Lee et al.
2016/0259469 A1 9/2016 Kim et al.

\* cited by examiner

DISPLAY DEVICE

CROSS-REFERENCE TO RELATED APPLICATION

This application claims priority to and the benefit of Korean Patent Application No. 10-2016-0151084, filed on Nov. 14, 2016 in the Korean Intellectual Property Office, the entire content of which is incorporated herein by reference.

BACKGROUND

1. Field

Aspects of embodiments of the present disclosure relate to a display device.

2. Description of Related Art

With the development of information technology, the importance of a display device that is a connection medium between a user and information has been emphasized. Owing to the importance of the display device, the use of various display devices, such as a liquid crystal display (LCD) device and an organic light-emitting display device, has increased.

Such a display device includes a plurality of pixels configured to display an image, and a display drive unit configured to control the pixels.

The display drive unit may be generally manufactured in the form of a chip and mounted in a display device in a chip-on-film (COF) manner.

SUMMARY

According to an aspect of various embodiments of the present disclosure, a display device is capable of preventing or substantially preventing a connector from being undesirably bent, thus preventing an image quality defect.

According to one or more embodiments of the present disclosure, a display device includes: a display panel including a plurality of pixels; a connector attached to the display panel; a display drive unit mounted on the connector; a touch sensor arranged over the display panel; a first adhesive layer between the touch sensor and the display panel; a window arranged over the touch sensor; and a second adhesive layer between the window and the touch sensor. A horizontal distance between the second adhesive layer and the display drive unit may be equal to or less than a horizontal distance between the display panel and the display drive unit.

In an embodiment, the horizontal distance between the second adhesive layer and the display drive unit may be equal to the horizontal distance between the display panel and the display drive unit.

In an embodiment, at least one of a horizontal distance between the first adhesive layer and the display drive unit or a horizontal distance between the touch sensor and the display drive unit may be equal to the horizontal distance between the display panel and the display drive unit.

In an embodiment, the horizontal distance between the second adhesive layer and the display drive unit may be less than the horizontal distance between the display panel and the display drive unit.

In an embodiment, the horizontal distance between the second adhesive layer and the display drive unit may be less than at least one of a horizontal distance between the first adhesive layer and the display drive unit or a horizontal distance between the touch sensor and the display drive unit.

In an embodiment, the at least one of the horizontal distance between the first adhesive layer and the display drive unit or the horizontal distance between the touch sensor and the display drive unit may be equal to the horizontal distance between the display panel and the display drive unit.

In an embodiment, at least one of a horizontal distance between the first adhesive layer and the display drive unit or a horizontal distance between the touch sensor and the display drive unit may be equal to the horizontal distance between the second adhesive layer and the display drive unit.

In an embodiment, the display device may include a spacer arranged on the connector and located adjacent to the first adhesive layer, the touch sensor, and the second adhesive layer.

In an embodiment, the spacer may be arranged between the connector and the window.

In an embodiment, the display device may further include a polarizing layer between the second adhesive layer and the touch sensor.

In an embodiment, a horizontal distance between the polarizing layer and the display drive unit may be equal to or greater than the horizontal distance between the second adhesive layer and the display drive unit.

In an embodiment, the display drive unit and the connector may form a chip-on-film (COF) structure.

In an embodiment, the touch sensor may be a capacitive touch sensor.

In an embodiment, each of the first and second adhesive layers may include an optically clear adhesive (OCA).

In an embodiment, each of the display panel, the touch sensor, and the window may be flexible.

DETAILED DESCRIPTION

Further details of various embodiments are described in the following description and the accompanying drawing figures.

Aspects and features of the present disclosure, and methods for achieving the same will be described or will be clear to one skilled in the art with reference to some embodiments described herein in further detail together with the accompanying drawings. However, it is noted that the present disclosure is not limited to the embodiments described and shown but, rather, can be embodied in various other ways. In this specification, "connected" or "coupled" refers to a component not only directly connected or coupled to another component, but also indirectly connected or coupled to another component through one or more intermediate components. Furthermore, in the drawings, portions unrelated to the present disclosure may be omitted for reasons of clarity. The same reference numerals are used throughout the drawings to designate the same or similar components.

Hereinafter, a display device in accordance with some embodiments of the present disclosure will be described with reference to the attached drawings.

Figure 1:
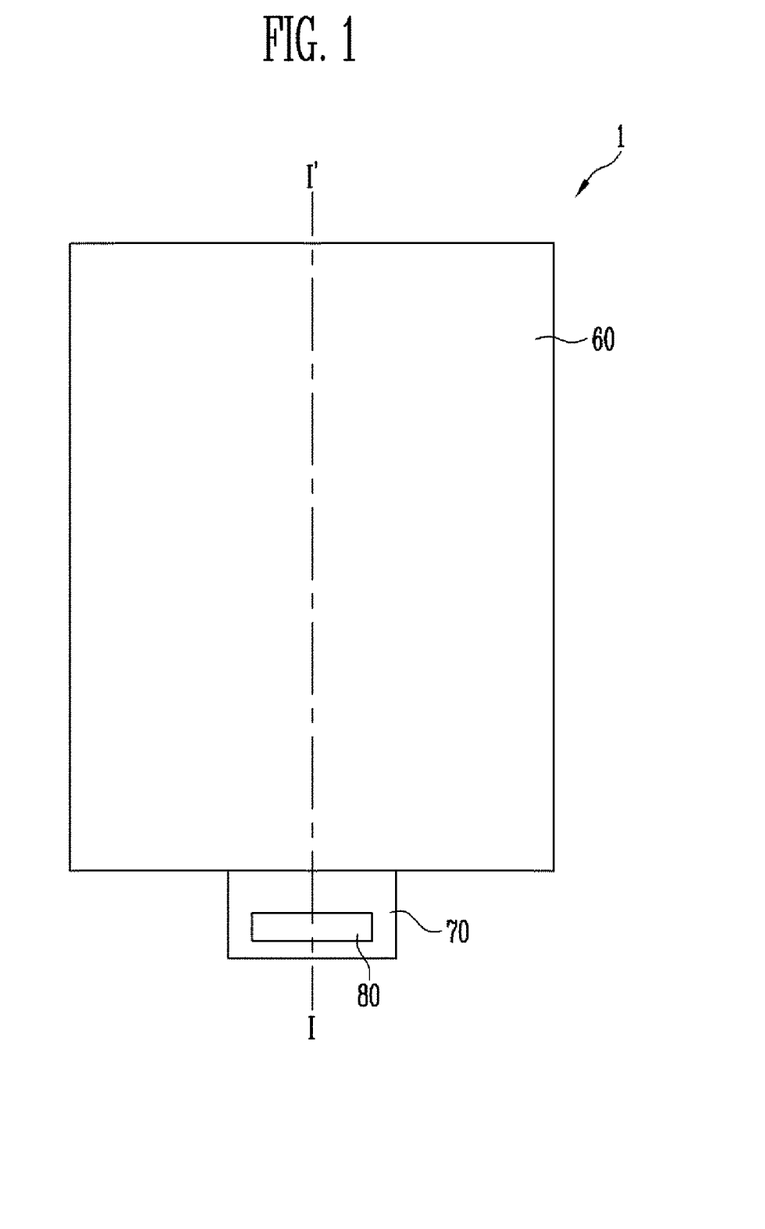
FIG. 1 is a diagram illustrating a display device in accordance with an embodiment of the present disclosure.
Figure 2:
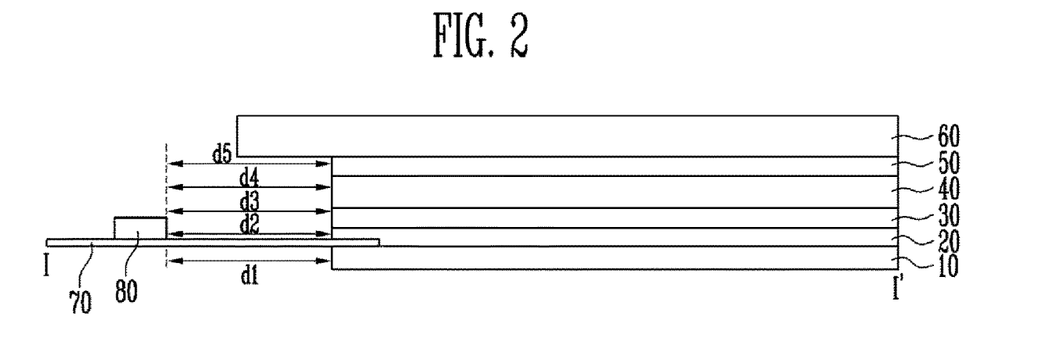
FIG. 2 is a sectional diagram illustrating the display device shown in FIG. 1.

FIG. 1 is a diagram illustrating a display device 1 in accordance with an embodiment of the present disclosure; and FIG. 2 is a sectional diagram illustrating the display device 1 of FIG. 1. Particularly, FIG. 2 illustrates a sectional diagram of the display device 1 based on line I-I' of FIG. 1.

Referring to FIGS. 1 and 2, the display device 1 in accordance with an embodiment may include a display panel 10, a first adhesive layer 20, a touch sensor 30, a polarizing layer 40, a second adhesive layer 50, a window 60, a connector 70, and a display drive unit 80.

The display panel 10 may be a device for providing an image to a user and may display the image using a plurality of pixels.

The display panel 10 may display an image under the control of the display drive unit 80.

In an embodiment, for example, the display panel 10 may be an organic light-emitting display panel including an organic light-emitting element.

The touch sensor 30 may be configured to sense a touch of a user which is inputted to the display device 1, and may be disposed on the display panel 10.

In an embodiment, the touch sensor 30 may be embodied by a capacitive-type touch sensor. However, the present disclosure is not limited thereto, and other types of touch sensors may be employed in embodiments of the present disclosure, so long as they can sense the touch of the user.

The first adhesive layer 20 may be disposed between the display panel 10 and the touch sensor 30. The display panel 10 and the touch sensor 30 may be attached to each other by the first adhesive layer 20.

In an embodiment, one side of the first adhesive layer 20 may make contact with the display panel 10 and the connector 70, and the other side of the first adhesive layer 20 may make contact with the touch sensor 30.

In an embodiment, the first adhesive layer 20 may include an optically clear adhesive (OCA) so as to allow light emitted from the display panel 10 to pass therethrough. However, the present disclosure is not limited thereto, and other materials having an adhesive function may also be used to form the first adhesive layer 20 of the present disclosure.

The polarizing layer 40 may be disposed on the touch sensor 30. In an embodiment, for example, the polarizing layer 40 may be disposed between the touch sensor 30 and the second adhesive layer 50.

The polarizing layer 40 may perform a polarization function, thus enhancing the visibility of an image.

However, in one or more embodiments, the polarizing layer 40 may be integrated into other components or omitted, or may be disposed at a position different from that illustrated in FIG. 2.

The window 60 may be disposed over the touch sensor 30. In an embodiment in which the polarizing layer 40 is provided, the touch sensor 30, the polarizing layer 40, and the window 60 may be successively disposed.

In an embodiment, for example, the window 60 may be transparent so as to allow light emitted from the display panel 10 to pass therethrough, and may be made of an insulating material, such as glass or resin. In an embodiment, the window 60 may be made of a flexible material so as to be bendable or foldable, and may have a single layer or multilayer structure.

The second adhesive layer 50 may be disposed between the window 60 and the touch sensor 30.

For example, in an embodiment in which the polarizing layer 40 is omitted, the second adhesive layer 50 may attach the window 60 with the touch sensor 30.

In this case, one side of the second adhesive layer 50 may make contact with the touch sensor 30, and the other side of the second adhesive layer 50 may make contact with the window 60.

In an embodiment in which the polarizing layer 40 is disposed on the touch sensor 30, the second adhesive layer 50 may be disposed between the polarizing layer 40 and the window 60. Hence, the polarizing layer 40 and the window 60 may be attached to each other by the second adhesive layer 50.

In this case, one side of the second adhesive layer 50 may make contact with the polarizing layer 40, and the other side of the second adhesive layer 50 may make contact with the window 60.

In an embodiment, the second adhesive layer 50 may include an optically clear adhesive (OCA) so as to allow light emitted from the display panel 10 to pass therethrough. However, the present disclosure is not limited thereto, and other materials having an adhesive function may also be used to form the second adhesive layer 50 of the present disclosure.

The display drive unit 80 may be mounted on the connector 70 and coupled with the display panel 10 by the connector 70.

The display drive unit 80 may supply a display drive signal to the display panel 10 through the connector 70 and thus control an image display operation of the display panel 10.

For example, the display drive signal may include a scan signal, a data signal, etc.

The connector 70 may be attached to the display panel 10 and have flexibility. In an embodiment, for example, the connector 70 may be provided in the form of a film, and form a COF structure along with the display drive unit 80.

Figure 10:
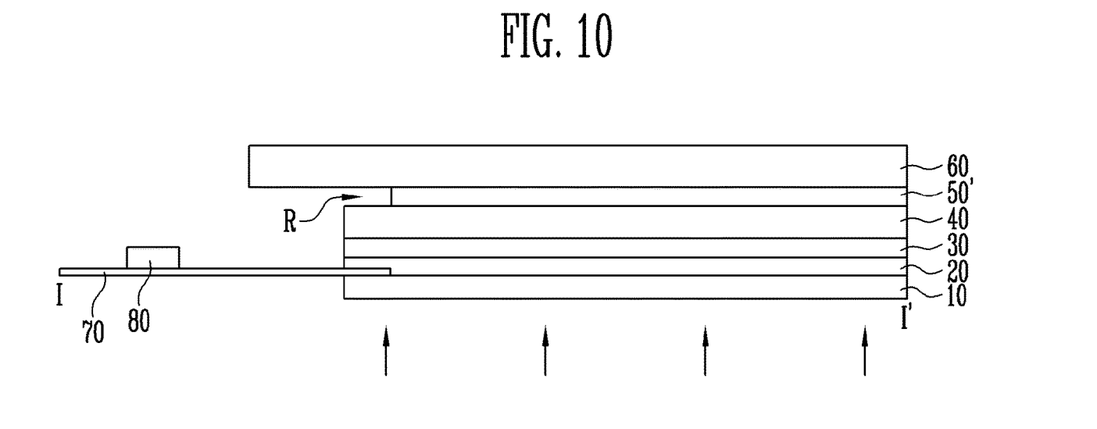
FIG. 10 is a diagram illustrating a comparative example of a display device.

In the display device 1 in accordance with one or more embodiments of the present disclosure, an empty space R shown in FIG. 10 may be avoided by setting a horizontal distance d5 between the second adhesive layer 50 and the display drive unit 80 to be equal to or less than a horizontal distance d1 between the display panel 10 and the display drive unit 80.

Therefore, an undesirable bending phenomenon of the connector 70 may be minimized or reduced, and a crack may be prevented or substantially prevented from being formed in a junction between the connector 70 and the display panel 10.

In an embodiment, for example, as shown in FIG. 2, the horizontal distance d5 between the second adhesive layer 50 and the display drive unit 80 may be equal to the horizontal distance d1 between the display panel 10 and the display drive unit 80.

In other words, the respective ends of the second adhesive layer 50 and the display panel 10 that are adjacent to the display drive unit 80 may be disposed at a same position along a horizontal axis. In an embodiment, the second adhesive layer 50 and the display panel 10 may have a same length.

In an embodiment, at least one of a horizontal distance d2 between the first adhesive layer 20 and the display drive unit 80 or a horizontal distance d3 between the touch sensor 30 and the display drive unit 80 may be equal to the horizontal distance d1 between the display panel 10 and the display drive unit 80.

In an embodiment, a horizontal distance d4 between the polarizing layer 40 and the display drive unit 80 may also be equal to the horizontal distance d1 between the display panel 10 and the display drive unit 80.

In other words, the respective ends of the display panel 10, the first adhesive layer 20, the touch sensor 30, and the polarizing layer 40 that are adjacent to the display drive unit 80 may be disposed at the same position along the horizontal axis. In an embodiment, the display panel 10, the first adhesive layer 20, the touch sensor 30, and the polarizing layer 40 may have the same length.

Each of the horizontal distances d1, d2, d3, d4, and d5 may be measured in a state in which the connector 70 is not folded toward a rear surface of the display device 1, that is, while the connector 70 is in an unfolded state, as shown in FIG. 2.

The above-described display device 1 may be a flexible display device. In this case, each of the components included in the display device 1, that is, each of the display panel 10, the first adhesive layer 20, the touch sensor 30, the polarizing layer 40, the second adhesive layer 50, and the window 60 may be flexible.

Figure 3:
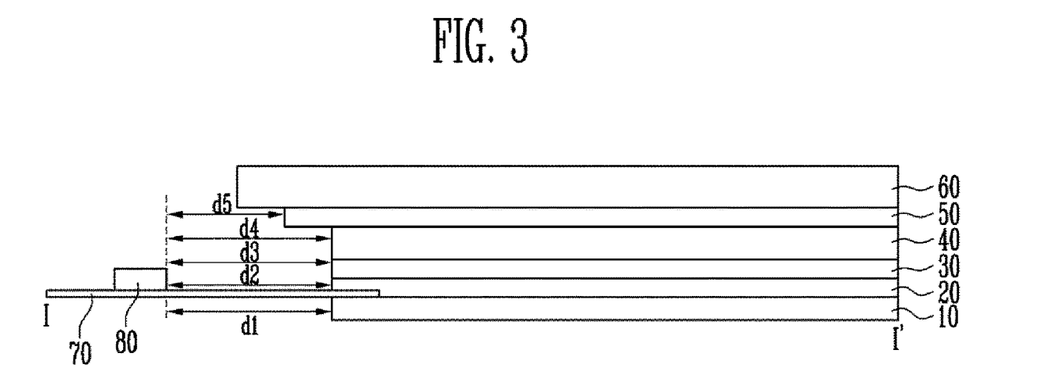
FIG. 3 is a sectional diagram illustrating a display device in accordance with an embodiment of the present disclosure.

FIG. 3 is a sectional diagram illustrating a display device in accordance with an embodiment of the present disclosure. The description of the present embodiment will be focused on differences between the present embodiment and the previously described embodiment, and repetitive descriptions thereof will be omitted.

Referring to FIG. 3, a horizontal distance d5 between the second adhesive layer 50 and the display drive unit 80 may be less than a horizontal distance d1 between the display panel 10 and the display drive unit 80.

In other words, the end of the second adhesive layer 50 that is adjacent to the display drive unit 80 may protrude outward compared to the end of the display panel 10 that is adjacent to the display drive unit 80. In an embodiment, the second adhesive layer 50 may have a length greater than that of the display panel 10.

In an embodiment, at least one of a horizontal distance d2 between the first adhesive layer 20 and the display drive unit 80 or a horizontal distance d3 between the touch sensor 30 and the display drive unit 80 may be equal to the horizontal distance d1 between the display panel 10 and the display drive unit 80.

In an embodiment, a horizontal distance d4 between the polarizing layer 40 and the display drive unit 80 may also be equal to the horizontal distance d1 between the display panel 10 and the display drive unit 80.

Figure 4:
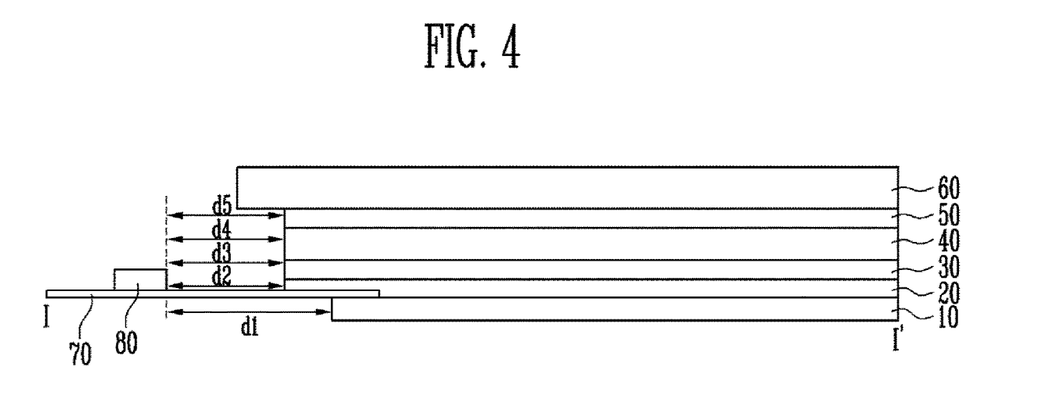
FIG. 4 is a sectional diagram illustrating a display device in accordance with an embodiment of the present disclosure.

FIG. 4 is a sectional diagram illustrating a display device in accordance with an embodiment of the present disclosure. The description of the present embodiment will be focused on differences between the present embodiment and the previously described embodiment, and repetitive descriptions thereof will be omitted.

Referring to FIG. 4, similar to the embodiment of FIG. 3, a horizontal distance d5 between the second adhesive layer 50 and the display drive unit 80 may be less than a horizontal distance d1 between the display panel 10 and the display drive unit 80.

Furthermore, at least one of a horizontal distance d2 between the first adhesive layer 20 and the display drive unit 80, a horizontal distance d3 between the touch sensor 30 and the display drive unit 80, or a horizontal distance d4 between the polarizing layer 40 and the display drive unit 80 may be less than the horizontal distance d1 between the display panel 10 and the display drive unit 80.

In an embodiment, for example, at least one of the horizontal distance d2 between the first adhesive layer 20 and the display drive unit 80, the horizontal distance d3 between the touch sensor 30 and the display drive unit 80, or the horizontal distance d4 between the polarizing layer 40 and the display drive unit 80 may be equal to the horizontal distance d5 between the second adhesive layer 50 and the display drive unit 80.

In other words, the end of each of the first adhesive layer 20, the touch sensor 30, the polarizing layer 40, and the second adhesive layer 50 that is adjacent to the display drive unit 80 may protrude outward compared to the end of the display panel 10 that is adjacent to the display drive unit 80. For instance, the respective ends of the first adhesive layer 20, the touch sensor 30, the polarizing layer 40, and the second adhesive layer 50 that are adjacent to the display drive unit 80 may be disposed at a same position along the horizontal axis.

At least one of the first adhesive layer 20, the touch sensor 30, the polarizing layer 40, or the second adhesive layer 50 may have a length greater than that of the display panel 10.

In this case, because the ends of the first adhesive layer 20, the touch sensor 30, the polarizing layer 40, and the second adhesive layer 50 extend by an additional length over the connector 70, a problem in which the connector 70 may be undesirably bent upward may be mitigated or avoided.

Therefore, the present embodiment may have improved effects, compared to that of the embodiment pertaining to FIG. 2 or FIG. 3.

Figure 5A:
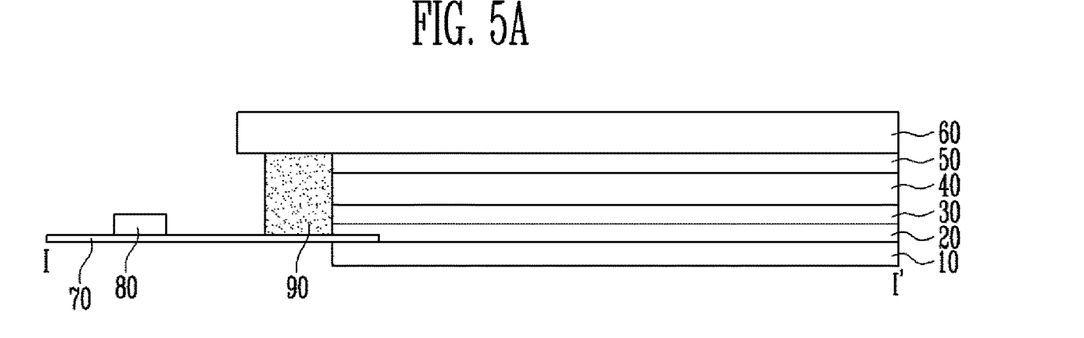
FIGS. 5A, 5B, and 5C are sectional diagrams illustrating embodiments of a display device including a spacer.
Figure 5B:
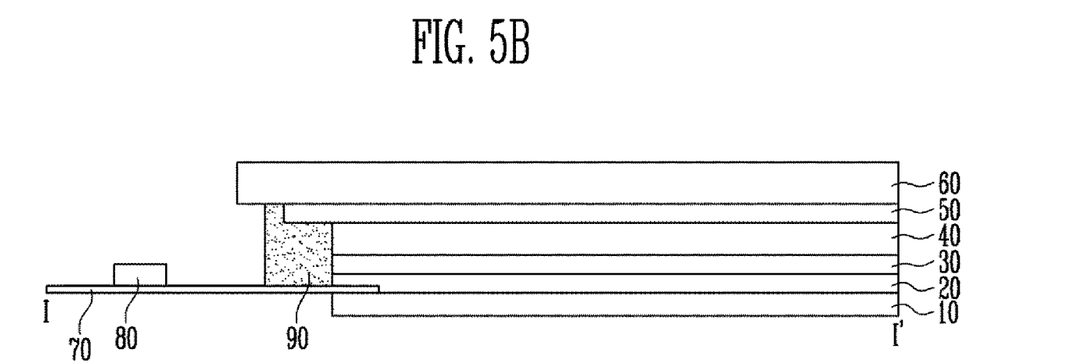
Figure 5C:
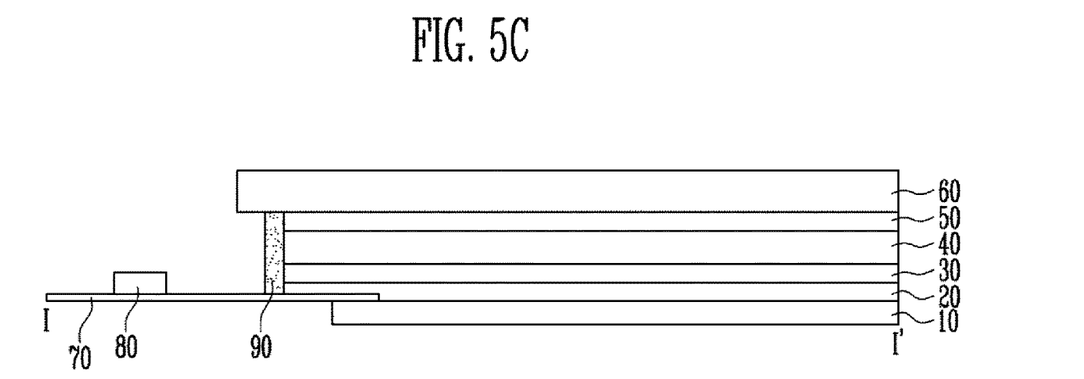

FIGS. 5A, 5B, and 5C are sectional diagrams illustrating embodiments of a display device 1 including a spacer 90. Particularly, FIG. 5A illustrates an embodiment in which the spacer 90 is added to the display device 1 shown in FIG. 2; FIG. 5B an embodiment in which the spacer 90 is added to the display device 1 shown in FIG. 3; and FIG. 5C illustrates an embodiment in which the spacer 90 is added to the display device 1 shown in FIG. 4.

Referring to FIGS. 5A, 5B, and 5C, the spacer 90 may be disposed on the connector 70 at a position adjacent to the first adhesive layer 20, the touch sensor 30, the polarizing layer 40, and the second adhesive layer 50.

In an embodiment, for example, an upper surface of the spacer 90 may come into contact with the window 60, and a lower surface of the spacer 90 may come into contact with the connector 70. In an embodiment, a side surface of the spacer 90 may come into contact with the respective ends of the first adhesive layer 20, the touch sensor 30, the polarizing layer 40, and the second adhesive layer 50.

In an embodiment, the spacer 90 may be formed of a material such as polyethylene terephthalate (PET), urethane, resin, or elastic material. However, the present disclosure is not limited thereto, and, in other embodiments, the spacer 90 may be formed of any of various materials.

In this structure, due to a reinforcement effect of the spacer 90, a problem in which the connector 70 may be undesirably bent upward may be minimized or reduced.

Figure 6:
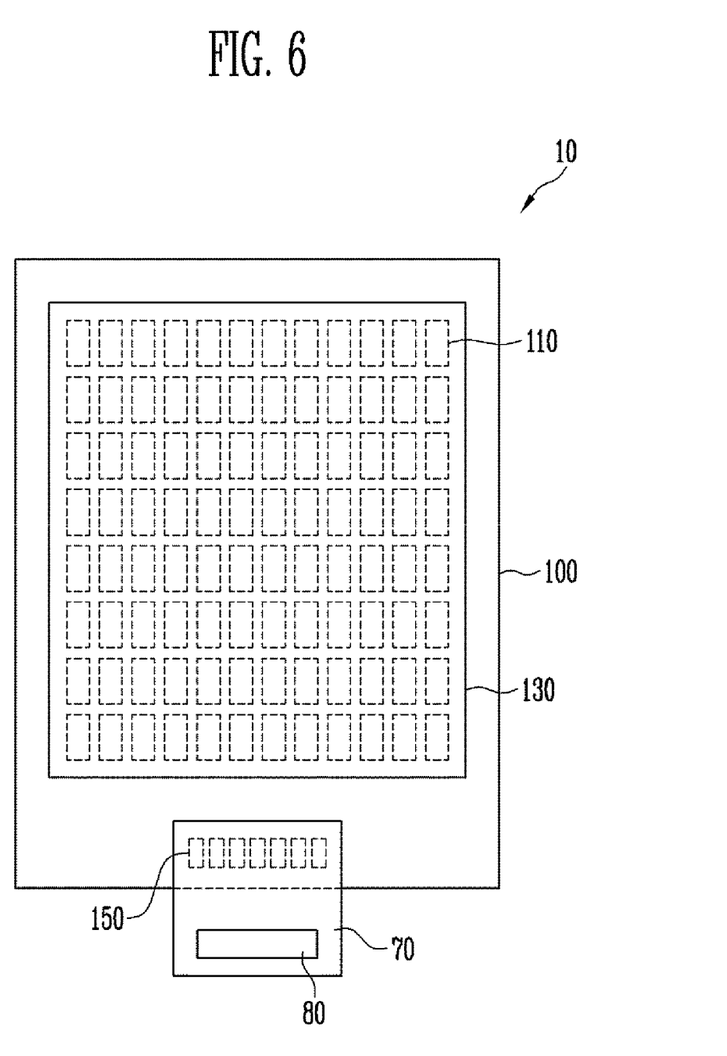
FIG. 6 is a diagram illustrating a display panel in accordance with an embodiment of the present disclosure.

FIG. 6 is a diagram illustrating a display panel 10 in accordance with an embodiment of the present disclosure.

Referring to FIG. 6, the display panel 10 in accordance with an embodiment of the present disclosure may include a display substrate 100, pixels 110, and an encapsulation layer 130.

The display substrate 100 may be made of an insulating material, such as glass or resin. In an embodiment, the display substrate 100 may be made of a flexible material so as to be bendable or foldable, and may have a single layer or multilayer structure.

In an embodiment, for example, the display substrate 100 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material constituting the display substrate 100 may be any of other various materials, and the display substrate 100, in an embodiment, may be made of fiber-reinforced plastic (FRP) or the like.

The pixels 110 may be disposed on a display area of the display substrate 100, and each pixel 110 may emit light having a certain color so as to provide an image (e.g., a predetermined image) to a user.

The encapsulation layer 130 may be formed on the pixels 110 to protect the pixels 110.

In an embodiment, the encapsulation layer 130 may prevent or substantially prevent the pixels 110 from being exposed to water, oxygen, etc., thus preventing or substantially preventing the pixels 110 from being damaged.

The encapsulation layer 130 may have a structure in which layers of a plurality of layers are stacked. For example, the encapsulation layer 130 may include at least one organic layer (not shown), and at least one inorganic layer (not shown).

In an embodiment in which the encapsulation layer 130 has a multilayer structure, organic layers and inorganic layers may be alternately stacked.

Pads 150 may be disposed in a non-display area of the display substrate 100, and an end of the connector 70 may be attached to the pads 150.

Hence, the display drive unit 80 may be electrically coupled with the pixels 110 through the connector 70, the pads 150, and signal lines (not shown). The signal lines may be coupled between the pads 150 and the pixels 110.

Figure 7:
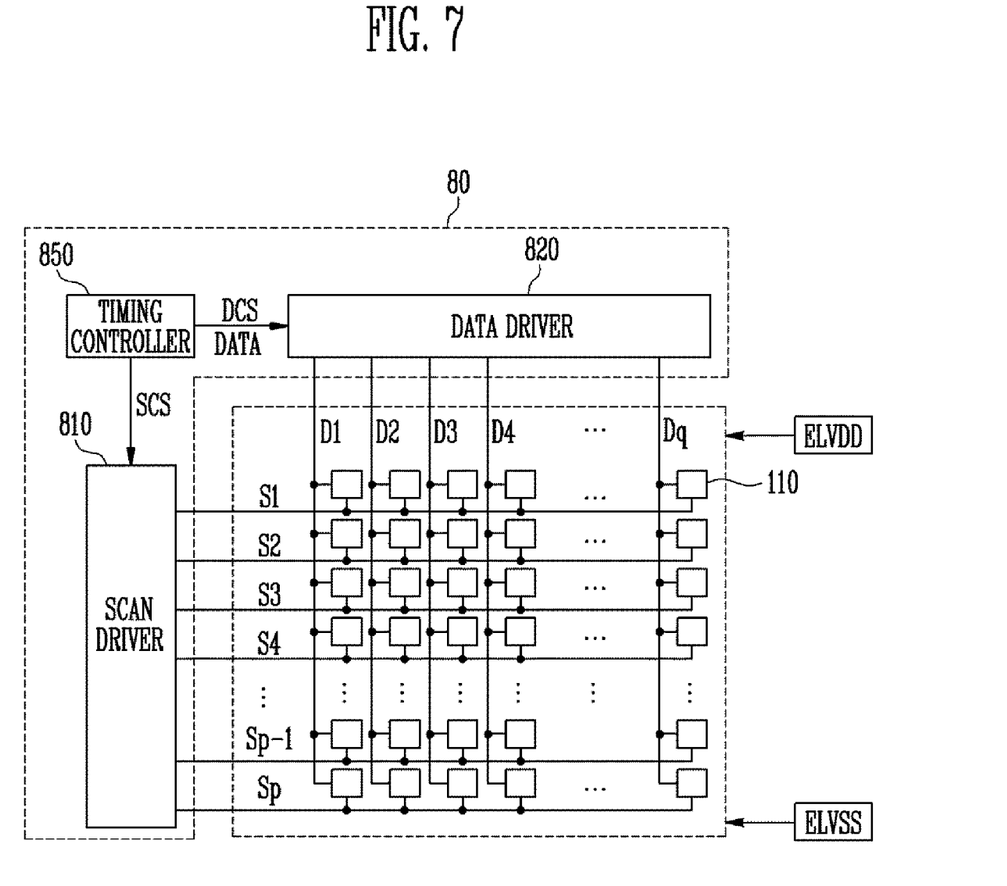
FIG. 7 is a schematic diagram illustrating a display drive unit and pixels in accordance with an embodiment of the present disclosure.

FIG. 7 is a schematic diagram illustrating a display drive unit 80 and pixels 110 in accordance with an embodiment of the present disclosure. For the sake of description, the illustration in FIG. 7 is focused on the pixels 110 of the display panel 10.

Referring to FIG. 7, the pixels 110 may be coupled with data lines D1 to Dq and scan lines S1 to Sp. For example, the pixels 110 may be arranged in the form of a matrix at intersections of the data lines D1 to Dq and the scan lines S1 to Sp.

The respective pixels 110 may receive data signals and scan signals through the corresponding data lines D1 to Dq and the corresponding scan lines S1 to Sp.

The pixels 110 may be coupled with a first power supply ELVDD and a second power supply ELVSS.

Each pixel 110 may include a light-emitting element (e.g., an organic light-emitting diode) and generate light corresponding to a data signal by current flowing from the first power supply ELVDD to the second power supply ELVSS via the light-emitting element.

The display drive unit 80 may include a scan driver 810, a data driver 820, and a timing controller 850.

The scan driver 810 may supply scan signals to the scan lines S1 to Sp in response to a scan driver control signal SCS. In an embodiment, for example, the scan driver 810 may successively supply scan signals to the scan lines S1 to Sp.

The data driver 820 may receive a data driver control signal DCS and image data DATA from the timing controller 850 and then generate data signals.

The data driver 820 may supply generated data signals to the data lines D1 to Dq.

If a scan signal is supplied to a certain scan line, some pixels 110 coupled with the certain scan line may receive data signals transmitted from the corresponding data lines D1 to Dq. Thus, the some pixels 110 may emit light with luminance corresponding to the received data signals.

The timing controller 850 may generate control signals for controlling the scan driver 810 and the data driver 820.

For example, the control signals may include a scan driver control signal SCS for controlling the scan driver 810, and a data driver control signal DCS for controlling the data driver 820.

In an embodiment, the timing controller 850 may generate the scan driver control signal SCS and the data driver control signal DCS using an external input signal.

The timing controller 850 may provide the scan driver control signal SCS to the scan driver 810 and provide the data driver control signal DCS to the data driver 820.

The timing controller 850 may translate image data input from an external device into image data DATA corresponding to the specifications of the data driver 820, and then supply the image data DATA to the data driver 820.

In an embodiment, the scan driver 810, the data driver 820, and the timing controller 850 may be formed into a single integrated circuit IC.

The display drive unit 80 formed into the integrated circuit IC may be mounted on the connector 70.

Figure 8:
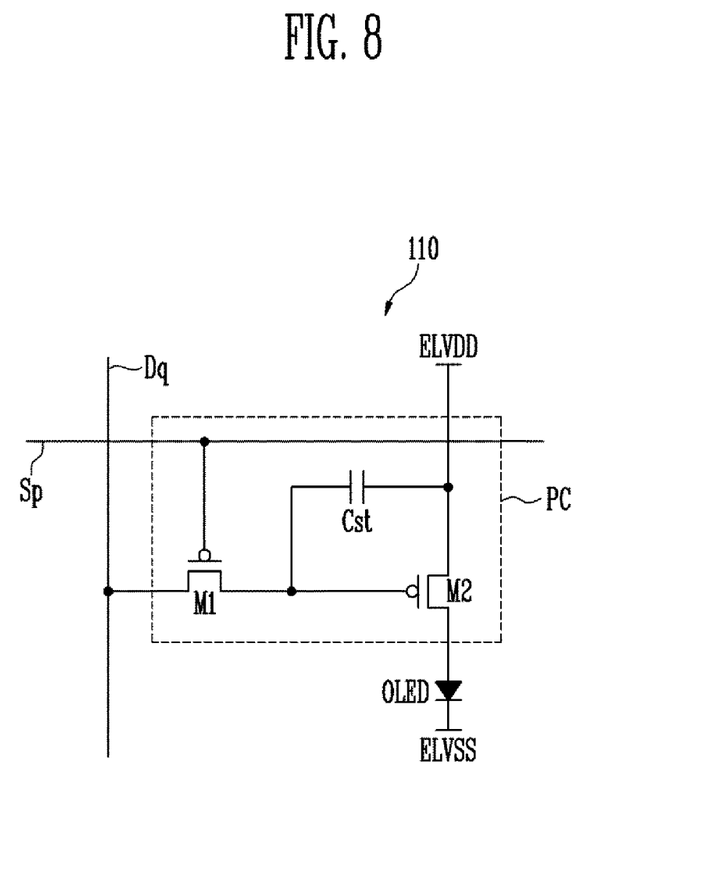
FIG. 8 is a diagram illustrating a pixel shown in FIG. 7, in accordance with an embodiment of the present disclosure.

FIG. 8 is a diagram illustrating an embodiment of a pixel shown in FIG. 7. For the sake of explanation, FIG. 8 illustrates only a pixel 110 coupled with a p-th scan line Sp and a q-th data line Dq.

Referring to FIG. 8, in an embodiment, the pixel 110 may include an organic light-emitting diode OLED, and a pixel circuit PC which is coupled to the q-th data line Dq and the p-th scan line Sp to control the organic light-emitting diode OLED.

An anode electrode of the organic light-emitting diode OLED may be coupled to the pixel circuit PC, and a cathode electrode thereof may be coupled to the second power supply ELVSS.

The organic light-emitting diode OLED may emit light having a luminance (e.g., a predetermined luminance) corresponding to current supplied from the pixel circuit PC.

The pixel circuit PC may store a data signal to be supplied to the q-th data line Dq when a scan signal is supplied from the p-th scan line Sp. The pixel circuit PC may control current to be supplied to the organic light-emitting diode OLED in response to the stored data signal.

In an embodiment, for example, the pixel circuit PC may include a first transistor M1, a second transistor M2, and a storage capacitor Cst.

The first transistor M1 may be coupled between the q-th data line Dq and the second transistor M2.

In an embodiment, for example, a gate electrode of the first transistor M1 may be coupled to the p-th scan line Sp, a first electrode thereof may be coupled to the q-th data line Dq, and a second electrode thereof may be coupled to a gate electrode of the second transistor M2.

When a scan signal is supplied from the p-th scan line Sp, the first transistor M1 is turned on so that a data signal is supplied from the q-th data line Dq to the storage capacitor Cst.

Here, the storage capacitor Cst may charge voltage corresponding to the data signal.

The second transistor M2 may be coupled between the first power supply ELVDD and the organic light-emitting diode OLED.

In an embodiment, for example, the gate electrode of the second transistor M2 may be coupled both to a first electrode of the storage capacitor Cst and to the second electrode of the first transistor M1. A first electrode of the second transistor M2 may be coupled both to a second electrode of the storage capacitor Cst and to the first power supply ELVDD. A second electrode of the second transistor M2 may be coupled to the anode electrode of the organic light-emitting diode OLED.

The second transistor M2 may function as a drive transistor and control current flowing from the first power supply ELVDD to the second power supply ELVSS via the organic light-emitting diode OLED in response to a voltage stored in the storage capacitor Cst.

The organic light-emitting diode OLED may generate light corresponding to current supplied from the second transistor M2.

The first electrode of each of the first and second transistors M1, M2 may be set as either a source electrode or a drain electrode. The second electrode of each of the first and second transistors M1, M2 may be set as an electrode different from that of the first electrode. For example, if the first electrode is set to a source electrode, the second electrode may be set to a drain electrode.

In FIG. 8, there is illustrated an example in which the transistors M1 and M2 are PMOS transistors, but in various embodiments, the transistors M1 and M2 may be embodied by NMOS transistors.

However, the above-described pixel structure of FIG. 8 is only one embodiment of the present disclosure, and the pixel 110 of the present disclosure is not limited to the above-described pixel structure. That is, the pixel 110 may have a circuit structure capable of supplying current to the organic light-emitting diode OLED, and any of various well-known structures may be selected as the structure of the pixel 110.

In an embodiment, the first power supply ELVDD may be a high-potential power supply, and the second power supply ELVSS may be a low-potential power supply.

In an embodiment, for example, the first power supply ELVDD may be set as a positive voltage, and the second power supply ELVSS may be set as a negative voltage or ground voltage.

Figure 9A:
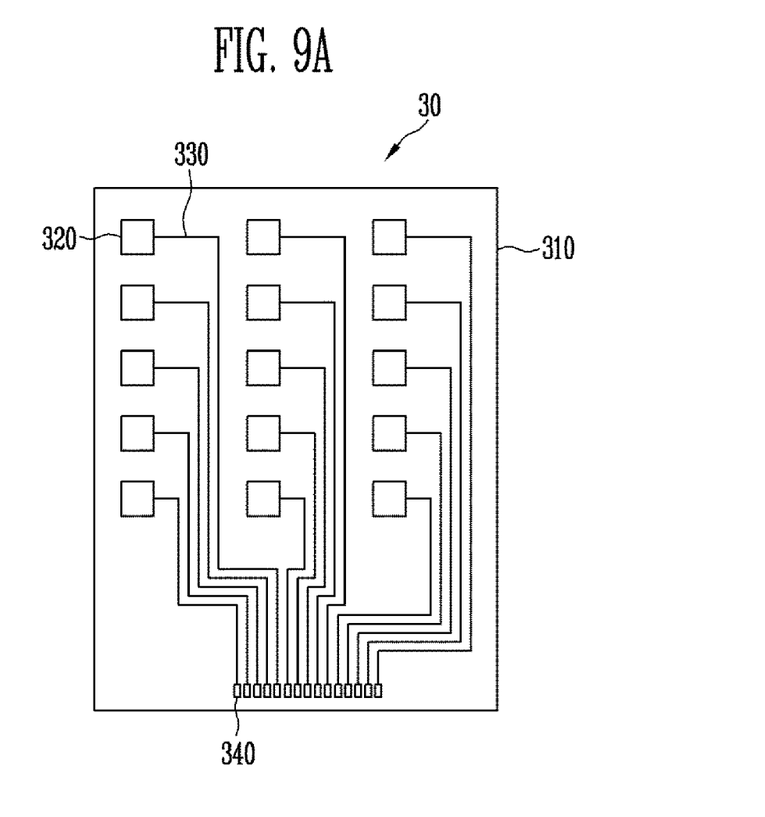
FIGS. 9A and 9B are diagrams illustrating a touch sensor in accordance with embodiments of the present disclosure.
Figure 9B:
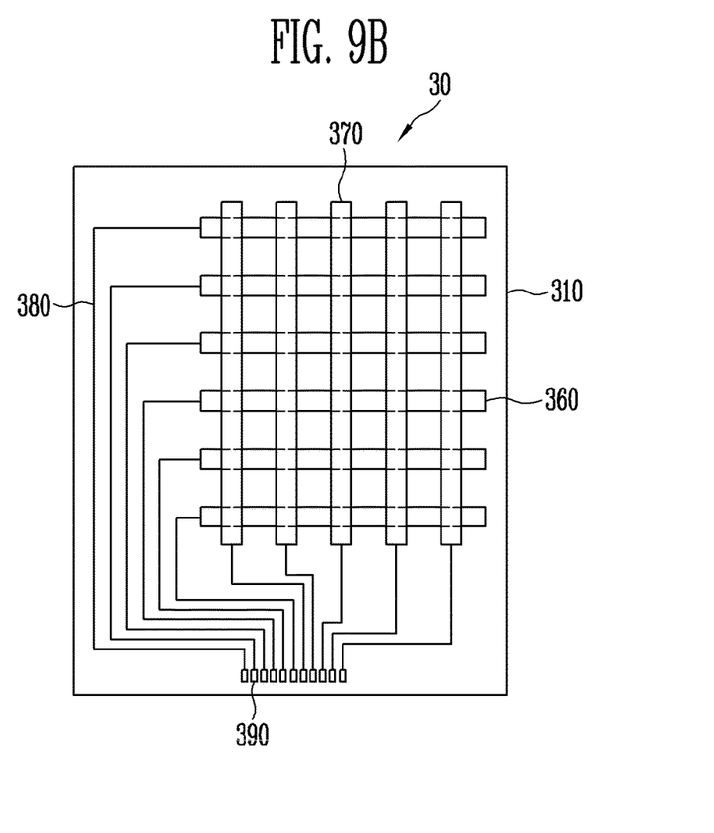

FIGS. 9A and 9B are diagrams illustrating a touch sensor 30 in accordance with embodiments of the present disclosure. Particularly, FIG. 9A illustrates a self-capacitive touch sensor 30; and FIG. 9B illustrates a mutual-capacitive touch sensor 30.

Referring to FIG. 9A, the touch sensor 30 in accordance with an embodiment of the present disclosure may be a self-capacitive touch sensor.

The touch sensor 30 may include a plurality of touch electrodes 320 and lines 330.

The touch electrodes 320 may be disposed on a sensor substrate 310 and may include a conductive material.

In an embodiment of the present disclosure, the conductive material may include any of metals or an alloy of metals. Examples of the metals may include gold (Au), silver (Ag), aluminum (Al), molybdenum (Mo), chromium (Cr), titanium (Ti), nickel (Ni), neodymium (Nd), copper (Cu), platinum (Pt), etc.

The touch electrodes 320 may be made of a transparent conductive material. Examples of the transparent conductive material may include a silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), a carbon nanotube, and graphene. Each of the touch electrodes 320 may include a single layer or multilayer structure.

The sensor substrate 310 may be made of an insulating material, such as glass or resin. In an embodiment, the sensor substrate 310 may be made of a flexible material so as to be bendable or foldable, and may have a single layer or multilayer structure.

In an embodiment, for example, the sensor substrate 310 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, a material of the sensor substrate 310 may be any of various materials, and, in an embodiment, the sensor substrate 310 may be made of fiber-reinforced plastic (FRP) or the like.

The lines 330 may be coupled between the touch electrodes 320 and pads 340. The lines 330 may be coupled to a sensor controller (not shown) through the pads 340.

In the case in which a touch is inputted to the touch sensor 30, the self-capacitances of touch electrodes 320 associated with the touch are changed. Thus, the sensor controller may detect the location of the touch using signals outputted from the touch electrodes 320.

Referring to FIG. 9B, the touch sensor 30 in accordance with an embodiment of the present disclosure may be a mutual-capacitive touch sensor.

In an embodiment, the touch sensor 30 may include first touch electrodes 360, second touch electrodes 370, and lines 380.

Each of the first touch electrodes 360 may extend in a first direction, and the first touch electrodes 360 may be arranged in a second direction intersecting with the first direction.

The second touch electrodes 370 may be spaced apart from the first touch electrodes 360 and thus can be operated, along with the first touch electrode 360, as a mutual-capacitive touch sensor.

The second touch electrodes 370 may be oriented in a direction intersecting with the first touch electrodes 360.

For example, each of the second touch electrodes 370 may extend in the second direction, and the second touch electrodes 370 may be arranged in the first direction.

Due to the above-mentioned arrangement of the first and second touch electrodes 360 and 370, mutual capacitances may be formed between the first touch electrodes 360 and the second touch electrodes 370. When a touch is inputted to the touch sensor 30, mutual capacitances associated with the touch are changed.

To prevent the first and second touch electrodes 360 and 370 from coming into contact with each other, an insulating layer (not shown) may be formed between the first touch electrodes 360 and the second touch electrodes 370.

The insulating layer may be formed over the entire surface area between the first touch electrodes 360 and the second touch electrodes 370, or may be partially formed at intersections between the first touch electrodes 360 and the second touch electrodes 370.

In an exemplary embodiment, the first touch electrodes 360 and the second touch electrodes 370 be formed of a transparent conductive material, but they may be formed of other conductive materials, e.g., opaque metal.

In an embodiment, for example, the first touch electrodes 360 and the second touch electrode 370 may be formed of any of the materials described above with respect to the touch electrode 320.

In FIG. 9B, there is illustrated an embodiment in which each of the first and second touch electrodes 360 and 370 has a bar shape, but a shape of the first and second touch electrodes 360 and 370 may be changed in various ways.

In an embodiment, the first touch electrodes 360 and the second touch electrodes 370 may form a mesh structure to have flexibility.

The lines 380 may be coupled between the touch electrodes 360 and 370 and pads 390. The lines 380 may be coupled to a sensor controller (not shown) through the pads 390.

In an embodiment, the first touch electrodes 360 may be supplied with a drive signal from the sensor controller. Each second touch electrode 370 may output a sensing signal reflecting a change in capacitance to the sensor controller.

As a result, the sensor controller may detect the location of the touch using the sensing signals outputted from the second touch electrodes 370.

Although the foregoing description has been focused on the capacitive touch sensor 30, other types of touch sensors may be employed.

For example, the touch sensor 30 may be embodied in various types, such as a resistive type, an infrared beam type, a surface acoustic wave type, an integral strain gauge type, and a piezoelectric type.

FIG. 10 is a diagram illustrating a comparative example of a display device.

In the case of the comparative example shown in FIG. 10, a length of a second adhesive layer 50' is less than that of a display panel 10.

The horizontal distance between the second adhesive layer 50' and a display drive unit 80 is greater than the horizontal distance between the display panel 10 and the display drive unit 80.

Thus, an empty space R is formed between a window 60 and a polarizing layer 40.

During a process of attaching the second adhesive layer 50' to the window 60, pressure is applied to a lower surface of the display panel 10 upward. In this case, elements 10, 20, 30, 40, and 70 disposed under the empty space R may be partially bent upward.

Particularly, the connector 70 is vulnerable to bending. Thus, when the connector 70 is bent, a crack may be formed in the junction between the connector 70 and the display panel 10, thus causing an image quality defect.

Various embodiments of the present disclosure may provide a display device capable of preventing or substantially preventing a connector from being undesirably bent, thus preventing or substantially preventing an image quality defect.

Some example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
a display panel including a display substrate and a plurality of pixels on the display substrate;
a connector attached to the display substrate;
a display drive unit mounted on the connector;
a touch sensor arranged over the display panel;
a first adhesive layer between the touch sensor and the display panel;
a window arranged over the touch sensor;
a second adhesive layer between the window and the touch sensor; and
a polarizing layer disposed between the second adhesive layer and the touch sensor, and performing a polarization function,
wherein, while the connector is in an unfolded state, a horizontal distance between the second adhesive layer and the display drive unit is less than a shortest horizontal distance between the display substrate and the display drive unit.

2. The display device according to claim 1, wherein, while the connector is in the unfolded state, the horizontal distance between the second adhesive layer and the display drive unit is less than at least one of a shortest horizontal distance between the first adhesive layer and the display drive unit or a shortest horizontal distance between the touch sensor and the display drive unit.

3. The display device according to claim 2, wherein, while the connector is in the unfolded state, the at least one of the shortest horizontal distance between the first adhesive layer and the display drive unit or the shortest horizontal distance between the touch sensor and the display drive unit is equal to the shortest horizontal distance between the display substrate and the display drive unit.

4. The display device according to claim 1, wherein, while the connector is in the unfolded state, at least one of a horizontal distance between the first adhesive layer and the display drive unit or a horizontal distance between the touch sensor and the display drive unit is equal to the horizontal distance between the second adhesive layer and the display drive unit.

5. The display device according to claim 1, further comprising a spacer arranged on the connector and located adjacent to the first adhesive layer, the touch sensor, and the second adhesive layer.

6. The display device according to claim 5, wherein the spacer is arranged between the connector and the window.

7. The display device according to claim 1, wherein, while the connector is in the unfolded state, a shortest horizontal distance between the polarizing layer and the display drive unit is equal to or greater than the horizontal distance between the second adhesive layer and the display drive unit.

8. The display device according to claim 1, wherein the display drive unit and the connector form a chip-on-film structure.

9. The display device according to claim 1, wherein the touch sensor is a capacitive touch sensor.

10. The display device according to claim 1, wherein each of the first and second adhesive layers comprises an optically clear adhesive.

11. The display device according to claim 1, wherein each of the display panel, the touch sensor, and the window is flexible.

* * * * *